US010289487B2

(12) United States Patent
Yang et al.

(10) Patent No.: US 10,289,487 B2
(45) Date of Patent: May 14, 2019

(54) METHOD FOR ACCESSING FLASH MEMORY MODULE AND ASSOCIATED FLASH MEMORY CONTROLLER AND MEMORY DEVICE

(71) Applicant: Silicon Motion Inc., Hsinchu County (TW)

(72) Inventors: Tsung-Chieh Yang, Hsinchu (TW); Hong-Jung Hsu, Kaohsiung (TW)

(73) Assignee: Silicon Motion Inc., Hsinchu County (TW)

( * ) Notice: Subject to any disclaimer, the term of this patent is extended or adjusted under 35 U.S.C. 154(b) by 0 days.

(21) Appl. No.: 15/495,993

(22) Filed: Apr. 25, 2017

(65) Prior Publication Data

US 2017/0315867 A1 Nov. 2, 2017

Related U.S. Application Data

(60) Provisional application No. 62/328,025, filed on Apr. 27, 2016, provisional application No. 62/328,027, filed on Apr. 27, 2016.

(30) Foreign Application Priority Data

Mar. 29, 2017 (TW) ............................. 106110436 A

(51) Int. Cl.
*G06F 11/10* (2006.01)
*G06F 3/06* (2006.01)
(Continued)

(52) U.S. Cl.
CPC ........ *G06F 11/1072* (2013.01); *G06F 3/0604* (2013.01); *G06F 3/064* (2013.01); *G06F 3/0619* (2013.01); *G06F 3/0688* (2013.01); *G11C 11/5628* (2013.01); *G11C 11/5635* (2013.01); *G11C 11/5642* (2013.01);
(Continued)

(58) Field of Classification Search
CPC ..... G11C 16/10; G11C 16/0483; G11C 16/16; G11C 16/26; G06F 11/1076; G06F 11/1008; G06F 3/0619; G06F 3/064; G06F 3/0611; G06F 3/0616; G06F 11/1072
See application file for complete search history.

(56) References Cited

U.S. PATENT DOCUMENTS 6,903,972 B2 6/2005 Lasser
7,710,777 B1 5/2010 Montierth
(Continued)

FOREIGN PATENT DOCUMENTS

TW M369528 U1 11/2009
TW 201535114 A 9/2015
(Continued)

*Primary Examiner* — Shelly A Chase
(74) *Attorney, Agent, or Firm* — Winston Hsu

(57) ABSTRACT

A method for accessing a flash memory module is provided. The flash memory module is a 3D flash memory module including a plurality of flash memory chips, each flash memory chip includes a plurality of blocks, each block includes a plurality of pages, and the method includes: configuring the flash memory chips to set at least a first super block and at least a second super block of the flash memory chips; and allocating the second super block to store a plurality of temporary parities generated when data is written into the first super block.

24 Claims, 8 Drawing Sheets

(51) Int. Cl.
*G11C 11/56* (2006.01)
*G11C 16/16* (2006.01)
*G11C 16/26* (2006.01)
*G11C 29/52* (2006.01)
*G11C 16/08* (2006.01)

(52) U.S. Cl.
CPC .............. *G11C 16/08* (2013.01); *G11C 16/16* (2013.01); *G11C 16/26* (2013.01); *G11C 29/52* (2013.01); *G11C 2211/5641* (2013.01)

(56) References Cited

U.S. PATENT DOCUMENTS

| | | | | |
|---|---|---|---|---|
| 8,327,066 | B2 | 12/2012 | Heo | |
| 8,792,277 | B2 | 7/2014 | Eggleston | |
| 8,892,981 | B2 | 11/2014 | Post | |
| 8,972,776 | B2 | 3/2015 | Baryudin | |
| 9,286,985 | B2 | 3/2016 | Kimura | |
| 9,685,242 | B2 | 6/2017 | Sugiyama | |
| 9,734,911 | B2 | 8/2017 | Sinclair | |
| 9,767,913 | B2 | 9/2017 | Nagashima | |
| 2006/0050314 | A1 | 3/2006 | Shiga | |
| 2008/0244356 | A1 | 10/2008 | Bliss | |
| 2010/0259983 | A1 | 10/2010 | Yoon | |
| 2010/0332922 | A1 | 12/2010 | Chang | |
| 2011/0283166 | A1 | 11/2011 | Kim | |
| 2011/0283167 | A1 | 11/2011 | Bliss | |
| 2012/0173920 | A1 | 7/2012 | Park | |
| 2012/0213005 | A1 | 8/2012 | Lee | |
| 2012/0246540 | A1 | 9/2012 | Lee | |
| 2013/0117620 | A1 | 5/2013 | Joo | |
| 2013/0297984 | A1 | 11/2013 | Yamaga | |
| 2013/0322171 | A1 | 12/2013 | Lee | |
| 2014/0068319 | A1 | 3/2014 | Daly | |
| 2014/0101372 | A1 | 4/2014 | Jung | |
| 2014/0129874 | A1* | 5/2014 | Zaltsman .............. | G06F 11/108 714/6.11 |
| 2014/0149828 | A1 | 5/2014 | Chang | |
| 2014/0185376 | A1 | 7/2014 | Sinclair | |
| 2014/0226400 | A1 | 8/2014 | Kimura | |
| 2014/0245105 | A1 | 8/2014 | Chung | |
| 2014/0325124 | A1 | 10/2014 | Antonakopoulos | |
| 2015/0058661 | A1 | 2/2015 | Yang | |
| 2015/0058699 | A1 | 2/2015 | Yang | |
| 2015/0058700 | A1 | 2/2015 | Yang | |
| 2015/0067439 | A1 | 3/2015 | Yamaki | |
| 2015/0117103 | A1 | 4/2015 | Rhie | |
| 2015/0169402 | A1 | 6/2015 | Wu | |
| 2015/0178149 | A1 | 6/2015 | Cai | |
| 2015/0248328 | A1 | 9/2015 | Yoon | |
| 2015/0255159 | A1 | 9/2015 | Tanaka | |
| 2015/0293713 | A1 | 10/2015 | Seo | |
| 2015/0347229 | A1* | 12/2015 | Higgins ................. | G11C 16/10 714/764 |
| 2016/0062829 | A1 | 3/2016 | Harasawa | |
| 2016/0104539 | A1 | 4/2016 | Kim | |
| 2016/0110102 | A1 | 4/2016 | Lee | |
| 2016/0110249 | A1 | 4/2016 | Orme | |
| 2016/0110252 | A1 | 4/2016 | Hyun | |
| 2016/0260489 | A1 | 9/2016 | Lee | |
| 2016/0306553 | A1* | 10/2016 | Ellis ...................... | G06F 3/0611 |
| 2016/0313931 | A1* | 10/2016 | Song .................. | G11C 16/0483 |
| 2016/0342345 | A1* | 11/2016 | Kankani ............... | G06F 3/0616 |
| 2017/0031751 | A1 | 2/2017 | Baek | |
| 2017/0046225 | A1 | 2/2017 | Yang | |
| 2017/0060425 | A1 | 3/2017 | Sunata | |
| 2017/0317693 | A1 | 11/2017 | Yang | |
| 2018/0018091 | A1 | 1/2018 | Shin | |

FOREIGN PATENT DOCUMENTS

| | | | |
|---|---|---|---|
| TW | 201603047 | A | 1/2016 |
| TW | 201612908 | A | 4/2016 |

* cited by examiner

| | | Data page address | | | |
|---|---|---|---|---|---|
| WL_G0 (WL0~WL3) | Lower data page | P0L | P1L | P2L | P3L |
| | Middle data page | P0M | P1M | P2M | P3M |
| | Upper data page | P0U | P1U | P2U | P3U |
| WL_G1 (WL4~WL7) | Lower data page | P4L | P5L | P6L | P7L |
| | Middle data page | P4M | P5M | P6M | P7M |
| | Upper data page | P4U | P5U | P6U | P7U |
| ⋮ | | | | | |
| WL_G47 | Lower data page | P188L | P189L | P190L | P191L |
| | Middle data page | P188M | P189M | P190M | P191M |
| | Upper data page | P188U | P189U | P190U | P191U |

FIG. 4

530

| | | Chip 512 | Chip 514 | Chip 522 | Chip 524 | Parity check code |
|---|---|---|---|---|---|---|
| WL_G0 | WL0 | P0 | P0 | P0 | P0 | S0 |
| | WL1 | P1 | P1 | P1 | P1 | S1 |
| | WL2 | P2 | P2 | P2 | P2 | S2 |
| | WL3 | P3 | P3 | P3 | P3 | S3 |
| WL_G1 | WL4 | P4 | P4 | P4 | P4 | S4 |
| | WL5 | P5 | P5 | P5 | P5 | S5 |
| | WL6 | P6 | P6 | P6 | P6 | S6 |
| | WL7 | P7 | P7 | P7 | P7 | S7 |
| WL_G2 | WL8 | P8 | P8 | P8 | P8 | S8 |
| | WL9 | P9 | P9 | P9 | P9 | S9 |
| | WL10 | P10 | P10 | P10 | P10 | S10 |
| | WL11 | P11 | P11 | P11 | P11 | S11 |
| WL_G3 | WL12 | P12 | P12 | P12 | P12 | S12 |
| | WL13 | P13 | P13 | P13 | P13 | S13 |
| | WL14 | P14 | P14 | P14 | P14 | S14 |
| | WL15 | P15 | P15 | P15 | P15 | S15 |
| WL_G4 | WL16 | P16 | P16 | P16 | P16 | S16 |
| | WL17 | P17 | P17 | P17 | P17 | S17 |
| | WL18 | P18 | P18 | P18 | P18 | S18 |
| | WL19 | P19 | P19 | P19 | P19 | S19 |
| ⋮ | ⋮ | ⋮ | ⋮ | ⋮ | ⋮ | ⋮ |
| WL_G46 | WL184 | P184 | P184 | P184 | P184 | S184 |
| | WL185 | P185 | P185 | P185 | P185 | S185 |
| | WL186 | P186 | P186 | P186 | P186 | S186 |
| | WL187 | P187 | P187 | P187 | P187 | S187 |
| WL_G47 | WL188 | P188 | P188 | P188 | P188 | S188 |
| | WL189 | P189 | P189 | P189 | P189 | S189 |
| | WL190 | P190 | P190 | P190 | P190 | S190 |
| | WL191 | P191 | P191 | P191 | P191 | S191 |

FIG. 6

METHOD FOR ACCESSING FLASH MEMORY MODULE AND ASSOCIATED FLASH MEMORY CONTROLLER AND MEMORY DEVICE

CROSS REFERENCE TO RELATED APPLICATIONS

This application claims priority of U.S. provisional application Ser. No. 62/328,025 filed on Apr. 27, 2016 and priority of U.S. provisional application Ser. No. 62/328,027 filed on Apr. 27, 2016, which are entirely incorporated herein by reference.

BACKGROUND OF THE INVENTION

1. Field of the Invention

The present invention relates to a flash memory, and more particularly to a method for accessing a flash memory module, a corresponding flash memory controller, and a memory device.

2. Description of the Prior Art

In order to make a flash memory with higher storage density and more capacity, the 3D flash memory manufacture becomes more important, and a variety of 3D NAND-type flash memory manufactures have been developed. For a conventional 3D NAND-type flash memory, since the manufacture structure becomes totally different and positions of floating gates are changed, it becomes more complicated for data writing and reading compared to a traditional 2D NAND-type flash memory, and thus some serious problems arise. For example, for a certain 3D NAND-type flash memories, multiple word lines may be defined as one word line set, and such word lines within the same word line set share the same control circuit. This inevitably causes that data errors also occur at floating gate transistors on the other word lines within a word line set if program fail occurs at floating gate transistors on one word line of the same word line set. In addition, data errors also occur at floating gate transistors on the other word lines within a word line set if one word line is open or two word lines are short for the same word line set. Accordingly, it is important to provide an effective error correction mechanism to maintain data integrity and accuracy as well as achieving the advantage of lower circuit costs.

SUMMARY OF THE INVENTION

It is therefore one of the objectives of the present invention to provide a method for accessing a flash memory module, a corresponding flash memory controller, and a memory device. The method employs RAID-like (Redundant Array of Independent Disks-like) error correction mechanism without occupying more flash memory space and merely with less buffer memory space, to solve the problems mentioned above.

According to one embodiment of the present invention, a method for accessing a flash memory module is disclosed, wherein the flash memory module is a 3D NAND-type flash memory module including a plurality of flash memory chips, each flash memory chip includes a plurality of blocks which include a plurality of multiple-level cell blocks and a plurality of single-level cell (SLC) blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages. The method comprises: encoding data to generate at least one parity check code, wherein the data is to be written into a first super block of the flash memory chips, and the first super block includes one multiple-level cell block of each flash memory chip among the flash memory chips; writing the data into the first super block; and writing the at least one parity check code into a second super block, wherein the second super block includes one SLC block of each flash memory chip among the flash memory chips.

According to another embodiment of the present invention, a flash memory controller is disclosed, wherein the flash memory controller is used to access a flash memory module, the flash memory module is a 3D NAND-type flash memory module including a plurality of flash memory chips, each flash memory chip includes a plurality of blocks which include a plurality of multiple-level cell blocks and a plurality of single-level cell (SLC) blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages. The flash memory controller comprises a memory, a microprocessor and a codec, where the memory is arranged for storing a program code, and the microprocessor is arranged for executing the program code to control access of the flash memory module. The codec encodes data to generate at least one parity check code, wherein the data is to be written into a first super block of the flash memory chips, and the first super block includes one multiple-level cell block of each flash memory chip among the flash memory chips; and the microprocessor writes the data into the first super block, and writes the at least one parity check code into a second super block, wherein the second super block includes one SLC block of each flash memory chip among the flash memory chips.

According to another embodiment of the present invention, a memory device is comprises a flash memory module and a flash memory controller. The flash memory module is a 3D NAND-type flash memory module including a plurality of flash memory chips, each flash memory chip includes a plurality of blocks which include a plurality of multiple-level cell blocks and a plurality of single-level cell (SLC) blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages. The flash memory controller is arranged for accessing the flash memory module, wherein when receiving a write request from a host device to write data into the flash memory module, the flash memory controller encodes the data to generate at least one parity check code, wherein the data is to be written into a first super block of the flash memory chips, and the first super block includes one multiple-level cell block of each flash memory chip among the flash memory chips; and the flash memory controller writes the data into the first super block, and writes the at least one parity check code into a second super block, wherein the second super block includes one SLC block of each flash memory chip among the flash memory chips.

According to another embodiment of the present invention, a method for accessing a flash memory module is disclosed, wherein the flash memory module is a 3D NAND-type flash memory module including a plurality of flash memory chips, each flash memory chip includes a plurality of blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages. The method comprises: configuring the flash memory chips to set at least one first super block and at least one second super block of the flash memory chips; and allocating the at least one second super block to store temporary parity check codes generated by an encoding procedure during programming data into the at least one first super block.

According to another embodiment of the present invention, a flash memory controller is disclosed, wherein the flash memory controller is used to access a flash memory module, the flash memory module is a 3D NAND-type flash memory module including a plurality of flash memory chips, each flash memory chip includes a plurality of blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages. The flash memory controller comprises a memory, a microprocessor and a codec, where the memory is arranged for storing a program code, and the microprocessor is arranged for executing the program code to control access of the flash memory module. In the operations of the flash memory controller, the microprocessor configures the flash memory chips to set at least one first super block and at least one second super block of the flash memory chips, and allocates the at least one second super block to store temporary parity check codes generated by an encoding procedure during programming data into the at least one first super block.

According to another embodiment of the present invention, a memory device is comprises a flash memory module and a flash memory controller. The flash memory module is a 3D NAND-type flash memory module including a plurality of flash memory chips, each flash memory chip includes a plurality of blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages. The flash memory controller is arranged for accessing the flash memory module, wherein the flash memory controller further configures the flash memory chips to set at least one first super block and at least one second super block of the flash memory chips, and allocates the at least one second super block to store temporary parity check codes generated by an encoding procedure during programming data into the at least one first super block.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram illustrating multiple word line sets in one block.

FIG. 6 is a diagram illustrating an example of flash memory controller programming data into the super block according to a first embodiment of the present invention.

DETAILED DESCRIPTION

Figure 1:
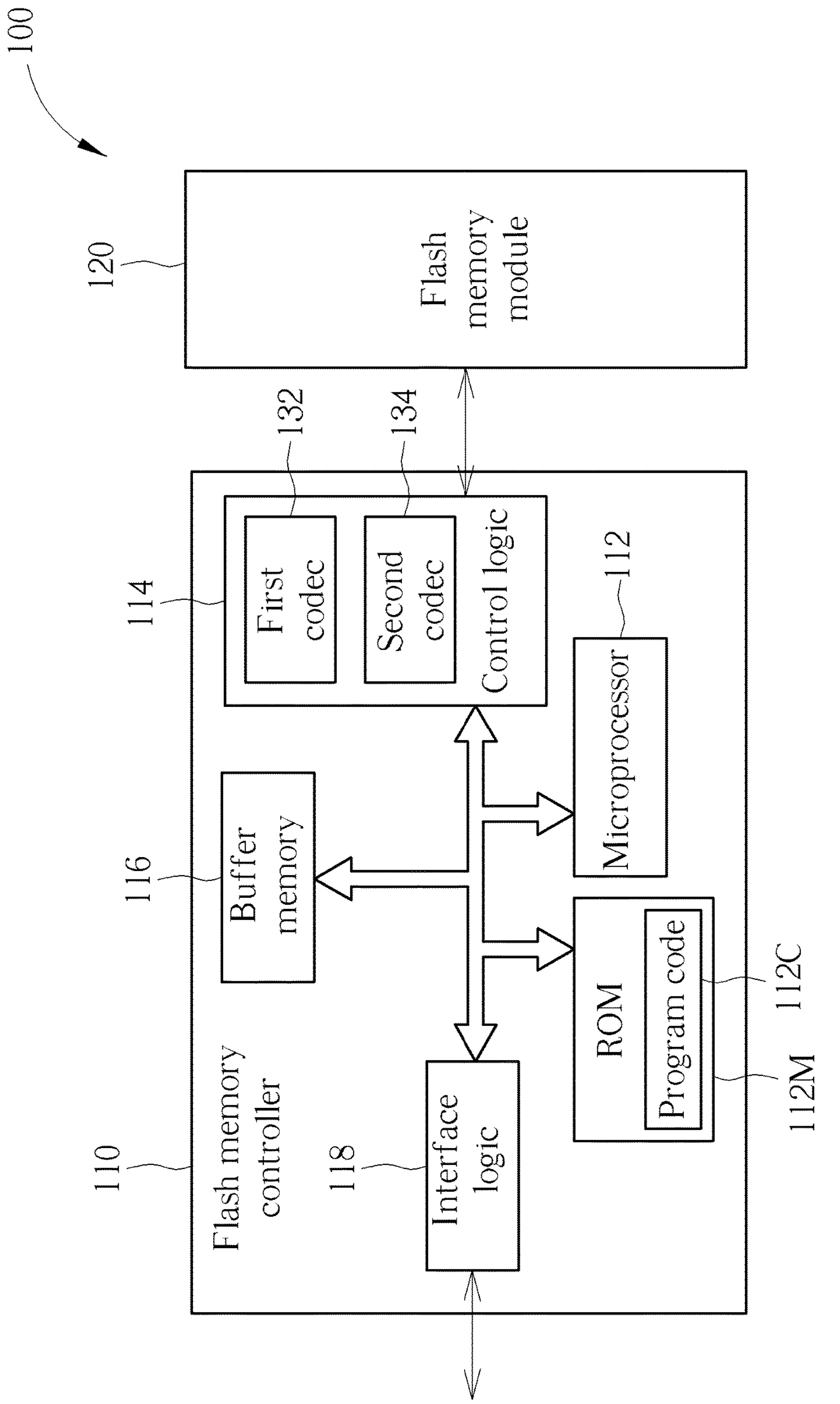
FIG. 1 is a diagram of a memory device according to an embodiment of the present invention.

Please refer to FIG. 1, which is a diagram of a memory device 100 according to an embodiment of the present invention. In the embodiment, the memory device 100 can be a portable memory device such as a memory card conforming to the standards of SD/NMC, CF, MS, and XD. The memory device 100 comprises a flash memory module 120 and a flash memory controller 110. The flash memory controller 110 is used for accessing the flash memory module 120. In the embodiment, the flash memory controller 110 comprises a microprocessor 112, read-only memory (ROM) 112M, control logic 114, buffer memory 116, and an interface logic 118. The read-only memory is used for storing program codes 112C. The microprocessor 112 is used for executing the program codes 112C to control the access of flash memory module 120. In other embodiments, the buffer memory 116 can be configured outside of the controller 110, and is implemented with a storage space allocated by a dynamic random access memory.

Typically, the flash memory module 120 may include multiple flash memory chips each including a plurality of blocks. For example, the controller, e.g. flash memory controller 110 executing the program codes 112C by using microprocessor 112, is arranged to perform copy, erase, and merge operations upon the flash memory module 120 wherein the copy, erase, and merge operations are performed block by block. Additionally, a block can record a particular number of data pages wherein the controller, e.g. flash memory controller 110 executing the program codes 112C by using microprocessor 112, is arranged to perform data programming upon the flash memory module 120 page by page.

In practice, the flash memory controller 110 executing the program codes 112C by using the microprocessor 112 can perform a variety of control operations by using its internal circuit elements. For instance, the controller 110 can use the control logic 114 to control the access of flash memory module 120 (more particularly to control the access of at least one block or at least one data page), use the buffer memory 116 to buffer data, and use the interface logic 118 to communicate with a host device (not shown in FIG. 1).

Additionally, in the embodiment, the control logic 114 comprises a first codec 132 and a second codec 134. The first codec 132 is used for encoding data which is to be programed/written into a block of flash memory module 120 to generate a corresponding error correction code wherein the first codec 132 can generate the corresponding error correction code by referring to content of a sector of a data page. The generated error correction code with the content of the sector of the data page is written/programed into the data page. Additionally, the second codec 134 is a RAID (Redundant Array of Independent Disks) compressor/decompressor used for encoding data to be programed into multiple flash memory chips to generate corresponding parity check codes; the description is detailed later.

Figure 2:
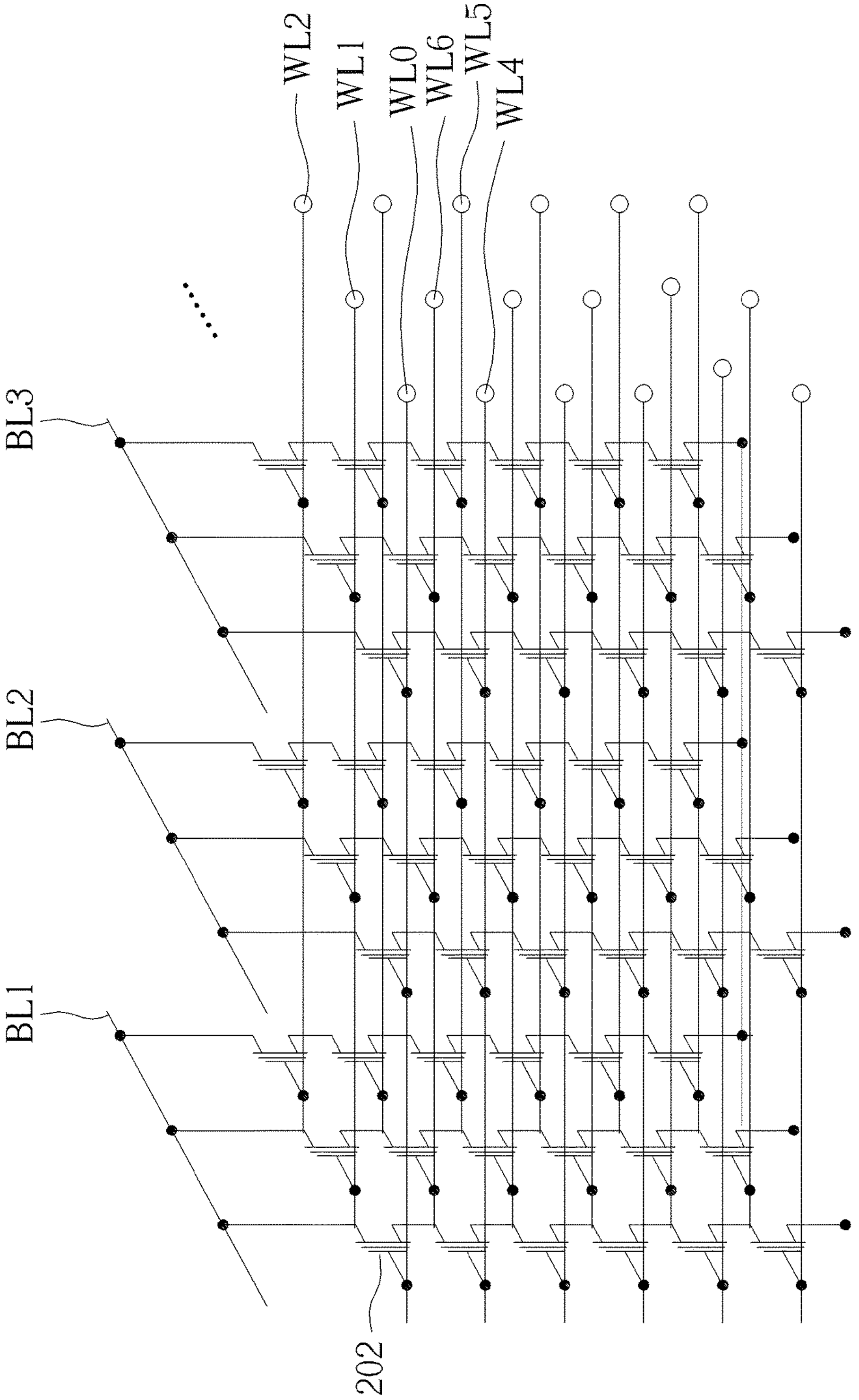
FIG. 2 is a diagram of a 3D NAND-type flash memory.

In the embodiment, the flash memory module 120 is a 3D NAND-type flash memory module. Please refer to FIG. 2, which is a diagram of a 3D NAND-type flash memory. As shown in FIG. 2, the 3D NAND-type flash memory comprises multiple floating gate transistors 202, and the structure of 3D NAND-type flash memory is made up of multiple bit lines (e.g. BL1-BL3) and multiple word lines (e.g. WL0-WL2 and WL4-WL6). One bit line can be also called one string. In FIG. 2, taking an example of a top plane, at least one data page constitutes all floating gate transistors on the word line WL0, and another at least one data page constitutes all floating gate transistors on the word line WL1; another at least one data page constitutes all floating gate transistors on the word line WL2, and other so on. Further, for example, the definition of one data page (logic data page) and the relation between such data page and word line WL0 may be different, and which may depend on different data programming types adopted by the flash memory. Specifically, all floating gate transistors on the word line WL0 correspond to one single logic data page when the flash memory adopts single-level cell (SLC) data programming. All floating gate transistors on the word line WL0 may correspond to two, three, or four logic data pages when the flash memory adopts multi-level cell (MLC) data programming. For example, a triple-level cell (TLC) memory structure means that all floating gate transistors on the word line WL0 correspond to three logical data pages. Instead, a quad-level cell (QLC) memory structure means that all floating gate transistors on the word line WL0 correspond to four logical data pages. The description for the TLC memory structure or QLC memory structure is not detailed here for brevity. Additionally, for the program/erase operation of flash memory controller 110, one data page is a minimum data unit which is programed by the controller 110 into the module 120, and one block is a minimum data unit which is erased by the controller 110; that is, the controller 110 programs at least one data page for one data programming operation, and erases at least one block for one erase operation.

Figure 3:
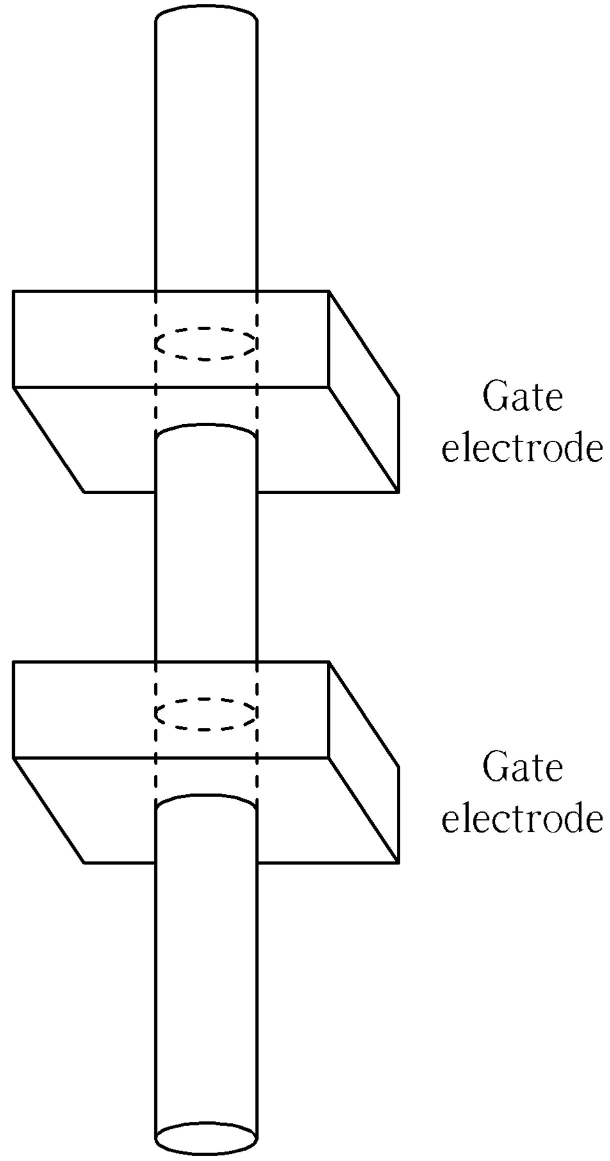
FIG. 3 is a schematic diagram illustrating floating gate transistors.

Please refer to FIG. 3, which is a schematic diagram illustrating floating gate transistors 202. As shown in FIG. 3, the gate and floating gate of each floating gate transistor are disposed all around its source and drain, to improve the capability of channel sensing.

It should be noted that the examples of 3D NAND-type flash memory and floating gate transistors 202 shown in FIG. 2 and FIG. 3 are not meant to be limitations of the present invention. In other embodiments, 3D NAND-type flash memory may be designed or configured as different structures; for example, a portion of word lines may be mutually connected. Also, the design or configuration of floating gate transistor 202 may be modified as different structures.

As mentioned above, in some conventional 3D NAND-type flash memory structure, multiple word lines are defined as or classified into a word line set, i.e. a set of word lines, and such word line set correspond to or include a common control circuit. This inevitably causes that data errors occur at other floating gate transistors on the other word lines of such word line set when programming data to the floating gate transistors on a word line of such word line set fails. In the embodiment, the word lines disposed/positioned on the same plane is configured as or classified into a word line set. Refer back to FIG. 2. Word lines WL0-WL3 are classified into a first word line set, and word lines WL4-WL7 are classified into a second word line set; and other so on. Refer to FIG. 4, which is a diagram illustrating multiple word line sets in one block. As shown in FIG. 4, it is assumed that the block has forty-eight 3D stacked planes, i.e. 48 word line sets. Each word line set has four word lines and thus has all transistors on total one hundred and ninety-two word lines. As shown in FIG. 4, the block has forty-eight word line sets which are represented by WL_G0-WL_G47. Additionally, in this figure, the block is a TLC block. That is, floating gate transistors on each word line can be used for storing data content of three data pages. As shown by FIG. 4, for example, floating gate transistors on word line WL0 included by the word line set WL_G0 can be used for storing lower data page P0L, middle data page P0M, and upper data page P0U. The floating gate transistors on word line WL1 included by the word line set WL_G0 can be used for storing lower data page P1L, middle data page P1M, and upper data page P1U. The floating gate transistors on word line WL2 included by the word line set WL_G0 can be used for storing lower data page P2L, middle data page P2M, and upper data page P2U. The floating gate transistors on word line WL3 included by the word line set WL_G0 can be used for storing lower data page P3L, middle data page P3M, and upper data page P3U. When the controller 110 programs or writes data into the data pages of word line set WL_G0, the controller 110 is arranged for sequentially programs data into the floating gate transistors on word lines WL0, WL1, WL2, and WL3. Even if data is successfully programed into word lines WL0 and WL1 but programming other data into word line WL2 fails (i.e. program fail), programming fail will occur at the word line set WL_G0 since the program fail of word line WL2 causes errors at the word lines WL0 and WL1.

Further, in some situations, even data has been successfully programed into the word line set WL_G0, there is a possibility that the data cannot be readout from word line set WL_G0 or reading errors occur. For instance, the data cannot be read if one word line open occurs; all the data of one word line set will become erroneous if one word line in such word line set is open. Further, if two word lines in different word line sets are shorted (e.g. word lines WL3 and WL4 are shorted), then all the data of two word line sets WL_G0 and WL_G1 cannot be read successfully. That is, the two word line sets WL_G0 and WL_G1 are equivalently shorted.

As mentioned above, since data errors may occur at one or two adjacent word line set(s) due to the program fail, word line open, and word line short when programming data into or reading data from a flash memory, to solve the problems, in the embodiment a method/mechanism for accessing flash memory module 120 is provided. One of the advantages is that the method/mechanism merely consumes less resource (i.e. occupies less memory space). The description of the method/mechanism is detailed in the following.

Figure 5:
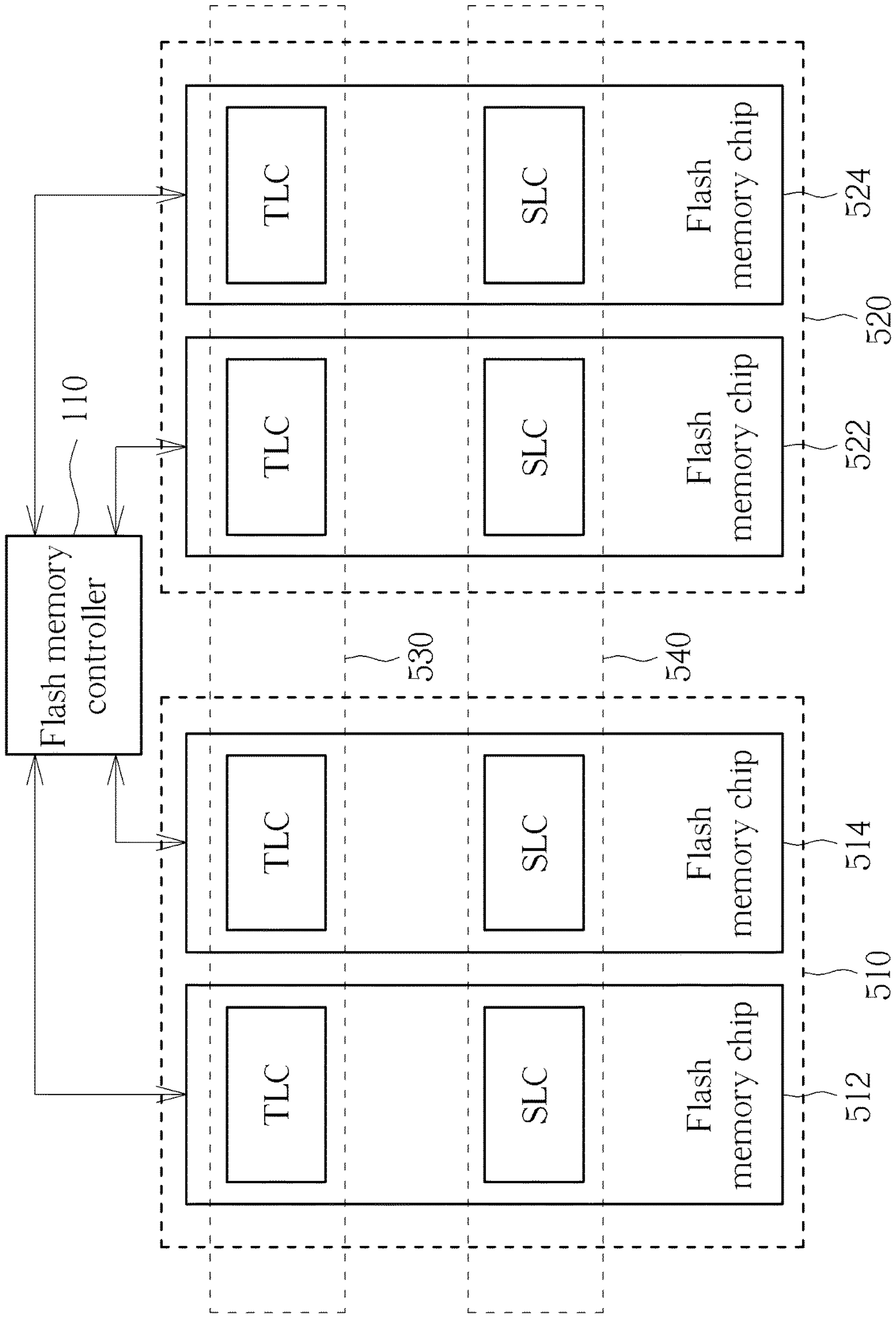
FIG. 5 is a diagram illustrating an example of the flash memory controller programming data into the flash memory module.

FIG. 5 is a diagram illustrating an example of the flash memory controller 110 programming data into the flash memory module 120. As shown in FIG. 5, the flash memory module 120 comprises multiple channels (in the embodiment, two channels 510 and 520), and each channel corresponds to a sequencer of flash memory controller 110 and comprises multiple flash memory chips. In the embodiment, the channel 510 comprises flash memory chips 512 and 514, and the channel 520 comprises flash memory chips 522 and 524. Additionally, a super block consists of one block of each flash memory chip 512, 514, 522, and 524. The flash memory controller 110 is arranged for programming data by super blocks. In the embodiment, the super block 530 comprises one TLC block of each flash memory chip 512, 514, 522, and 524; and the super block 540 comprises one SLC block of each flash memory chip 512, 514, 522, and 524. In other embodiments, the super block 530 may comprise one QLC block of each flash memory chip 512, 514, 522, and 524. This is not meant to be a limitation.

Refer to FIG. 5 and FIG. 6 together, where FIG. 6 is a diagram illustrating an example of flash memory controller 110 programming data into the super block 530 according to a first embodiment of the present invention. Each data unit is programed into respective one page of the flash memory chips 512, 514, 522, and 524. For instance, the first data unit is programed into the data pages P0 of flash memory chips 512, 514, 522, and 524. The second data unit is programed into the data pages P1 of the flash memory chips 512, 514, 522, and 524; and others so on. The (N)-th data unit is programed into the data pages P(N−1) of the flash memory chips 512, 514, 522, and 524; for example, N is equal to 192. Refer to FIG. 6, when the flash memory controller 110 is arranged to program the first data unit into the super block 530, the first codec 132 encodes different portions of the first data unit to generate corresponding error correction codes, and then the first data unit with the corresponding error correction codes generated by the first codec 132 are to be programed into a first data page P0 of each of flash memory chips 512, 514, 522, and 524. Specifically, the first codec 132 encodes a first data portion of the first data unit to generate an error correction code, and the first data portion with the generated error correction code are to be programed into first data page P0 of flash memory chip 512. The first codec 132 then encodes a second data portion of the first data unit to generate an error correction code, and the second data portion with the generated error correction code are to be programed into the first data page P0 of flash memory chip 514. The first codec 132 then encodes a third data portion of the first data unit to generate an error correction code, and the third data portion with the generated error correction code are to be programed into the first data page P0 of flash memory chip 522. The first codec 132 then encodes a fourth data portion (a last data portion) of the first data unit to generate an error correction code, and the fourth data portion with the generated error correction code are to be programed into the first data page P0 of flash memory chip 524. It should be noted that the operation of first codec 132 can be performed upon one sector data each time, and each data page consists of multiple sectors. Before programming/writing the first data unit with the error correction codes generated by the first codec 132 into the super block 530, the second codec 134 of flash memory controller 110 is arranged for performing RAID encoding upon the first data unit with the error correction codes to generate a first parity check code S0. In one embodiment, the second codec 134 can employ RS (Reed-Solomon) encoding operation or XOR (exclusive-OR) encoding operation upon the data content to be programed into the first data page P0 of each of flash memory chips 512, 514, 522 and 524, to generate the first parity check code S0. For example, the second codec 134 can be arranged to perform an XOR encoding operation upon first bits of the first data pages P0 of the flash memory chips 512, 514, 522 and 524 to generate a first bit of the first parity check code S0, the second codec 134 can be arranged to perform an XOR encoding operation upon second bits of the first data pages P0 of the flash memory chips 512, 514, 522 and 524 to generate a second bit of the first parity check code S0, the second codec 134 can be arranged to perform an XOR encoding operation upon third bits of the first data pages P0 of the flash memory chips 512, 514, 522 and 524 to generate a third bit of the first parity check code S0, and so on.

The first parity check code S0 generated by second codec 134 is used for correcting error(s) occurring at the first data page P0 of anyone flash memory chip among the flash memory chips 512, 514, 522, and 524. For example, if errors occur at the first data page P0 of flash memory chip 512 and cannot be corrected by the error correction codes generated by first codec 132, the second codec 134 can be arranged to read data content of all first data pages P0 of other flash memory chips 514, 522, 524 and the first parity check code S0 to perform error correction so as to determine correct data content of the first data page P0 of the flash memory chip 512.

Further, the first parity check code S0 generated by second codec 134 can be temporarily stored in the buffer memory 116 of the flash memory controller 110.

Further, during data programing of the first data unit, the flash memory controller 110 can be arranged to read and then check the data to determine whether the data has been programed successfully. When the data is erroneously programed or program fails, the second codec 134 can directly use the first parity check code S0 stored in the buffer memory 116 to correct the data which has been read for checking. Since the flash memory module 120 does not directly correct/modify data which has been programed, the corrected data (i.e. the first data unit has been corrected) with other data of super block 530 can be programed into another super block after a waiting time period. In addition, after the flash memory controller 110 determines that the first data unit is programmed/written into the first page P0 of the flash memory chips 512, 514, 522 and 524 successfully, the flash memory controller 110 will move the first parity check code S0 from the buffer memory 116 to the super block 540.

When the flash memory controller 110 is arranged to program a second data unit into the super block 530, the first codec 132 encodes different portions of the first data unit to generate corresponding error correction codes, and then the second data unit with the corresponding error correction codes generated by the first codec 132 are to be programed into a second data page P1 of each of flash memory chips 512, 514, 522, and 524. Before programming/writing the second data unit with the error correction codes generated by the first codec 132 into the super block 530, the second codec 134 of flash memory controller 110 is arranged for performing RAID encoding upon the second data unit with the error correction codes to generate a second parity check code S1. In one embodiment, the second codec 134 can employ RS (Reed-Solomon) encoding operation or XOR (exclusive-OR) encoding operation upon the data content to be programed into the second data page P1 of each of flash memory chips 512, 514, 522 and 524, to generate the second parity check code S1.

Further, the second parity check code S1 generated by second codec 134 can be temporarily stored in the buffer memory 116 of flash memory controller 110.

Similarly, during data programing of the second data unit, the flash memory controller 110 can be arranged to read and then check the data to determine whether the data has been programed successfully. When the data is erroneously programed or program fails, the second codec 134 can directly use the second parity check code S1 stored in the buffer memory 116 to correct the data which has been read for checking. Since the flash memory module 120 does not directly correct/modify data which has been programed, the corrected data (i.e. the second data unit has been corrected) with other data of super block 530 can be programed into another super block after a waiting time period.

It should be noted that the data pages P0 of flash memory chips 512, 514, 522 and 524 may be damaged when data is erroneously programed during data programming of the second data unit since the data pages P0 and P1 belong to the same word line set WL_G0. For instance, if data is erroneously programed into the data page P1 of flash memory chip 514 during data programming of the second data unit, then errors will occur at the data page P0 in flash memory chip 514, which has been successfully programed. In this situation, because the first parity check code S0 may be not stored in the buffer memory 116, the flash memory controller 110 can read the first parity check code S0 from the super block 540 to correct the first data unit which is read out from the super block 530.

Based on the same operation, the flash memory controller 110 programs/writes a third data unit into the third data pages P2 of flash memory chips 512, 514, 522 and 524 and generates a corresponding third parity check code S2, and then programs/writes a fourth data unit into the fourth data pages P3 of flash memory chips 512, 514, 522, and 524 and generates a corresponding fourth parity check code S3. After that, data programming for the word line set WL_G0 is completed.

Similarly, the flash memory controller 110 then is arranged for respectively programming/writing the fifth, sixth, seventh, . . . , and (184)-th data units into flash memory chips 512, 514, 522 and 524, wherein the second codec 134 is arranged for performing the encoding operation upon the fifth, sixth, seventh, . . . , and (184)-th data units to respectively generate different parity check codes S4-S183. Then, the parity check codes S4-S183 are stored into the super block 540.

For the last two word line sets WL_G46 and WL_G47 of super block 530, the controller 110 is arranged for processing corresponding parity check codes and programming the processed parity check codes into data pages P184-P191 of the last chip (i.e. chip 524). In order to solve the problems generated due to program fail, word line open, and word line short of word line set (s), the controller 110 is arranged to classify all word line sets into a group of multiple odd word line sets (i.e. WL_G0, WL_G2, WL_G4, WL_G6, . . . , WL_G44, and WL_G46) and a group of multiple even multiple word line sets (i.e. WL_G1, WL_G3, WL_G5, WL_G7, . . . , WL_G45, and WL_G47) according to the order of data programming when processing corresponding parity check codes. For the (185)-th data unit, the flash memory controller 110 is arranged for programming/writing the (185)-th data unit with the error correction code generated by first codec 132 into the data pages P184 of flash memory chips 512, 514, and 522 (i.e. the last word line set WL_G46 among the group of odd word line sets), and does not program the data into the data page P184 of flash memory chip 524. Before programming/writing the (185)-th data unit into super block 530, the second codec 134 is arranged for encoding the (185)-th data unit and the corresponding error correction code to generate the (185)-th parity check codes S184. For example, the flash memory controller 110 is arranged for reading the first parity check code (S0, S8, S16, . . . , S176) of each word line set among the group of odd word line sets (i.e. WL_G0, WL_G2, WL_G4, WL_G6, . . . , WL_G44) from the super block 540, and the second codec 134 is arranged for performing XOR operation upon the parity check codes (S0, S8, S16, . . . , S176) with parity check codes S184 to generate a final parity check code SF0. The flash memory controller 110 then programs the (185)-th data unit into the data pages P184 of the flash memory chips 512, 514 and 522, and programs the final parity check code SF0 into the data page P184 of flash memory chip 524. In one embodiment, the second codec 134 performs XOR operation upon first bits of the parity check codes (S0, S8, S16, . . . , S184) to generate a first bit of the final parity check code SF0, and the second codec 134 performs XOR operation upon second bits of the parity check codes (S0, S8, S16, . . . , S184) to generate a second bit of the final parity check code SF0, and so on. In addition, the (185)-th parity check codes S184 can be stored into the super block 540.

For the (186)-th data unit, the flash memory controller 110 is arranged for programming/writing the (186)-th data unit with the error correction code generated by first codec 132 into the data pages P185 of flash memory chips 512, 514 and 522 (i.e. the last word line set WL_G47 among the group of odd word line sets), and does not program the data into the data page P185 of flash memory chip 524. Before programming/writing the (186)-th data unit into super block 530, the second codec 134 is arranged for encoding the (186)-th data unit and the corresponding error correction code to generate the (186)-th parity check codes S185. For example, the flash memory controller 110 is arranged for reading the parity check codes (S1, S9, S17, . . . , S177) of each word line set among the group of odd word line sets (i.e. WL_G0, WL_G2, WL_G4, WL_G6, . . . , WL_G44) from the super block 540, and the second codec 134 is arranged for performing XOR operation upon the parity check codes (S1, S9, S17, . . . , S177) with parity check codes S185 to generate a final parity check code SF1. The flash memory controller 110 then programs the (186)-th data unit into the data pages P185 of the flash memory chips 512, 514 and 522, and programs the final parity check code SF1 into the data page P185 of flash memory chip 524. In one embodiment, the second codec 134 performs XOR operation upon first bits of the parity check codes (S1, S9, S17, . . . , S185) to generate a first bit of the final parity check code SF1, and the second codec 134 performs XOR operation upon second bits of the parity check codes (S1, S9, S17, . . . , S185) to generate a second bit of the final parity check code SF1, and so on. In addition, the (186)-th parity check codes S185 can be stored into the super block 540.

Based on the similar operation, for the (187)-th-(192)-th data units, the flash memory controller 110 is arranged for programming/writing the (187)-th-(192)-th data units with corresponding error correction codes generated by first codec 132 into data pages P186-P191 of the flash memory chips 512, 514 and 522. The second codec 134 also generates final parity check codes SF2-SF7 based on similar operations, and the final parity check codes SF2-SF7 are respectively programmed/written into data pages P186-P191 of the flash memory chip 524.

Figure 7:
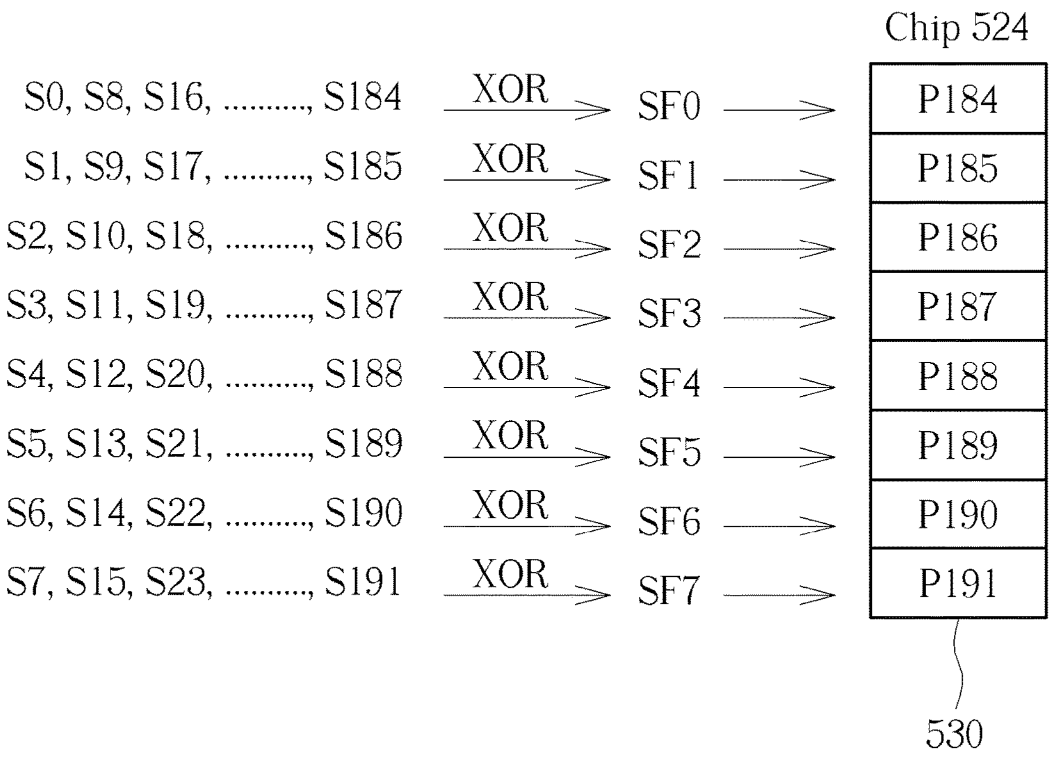
FIG. 7 is a diagram showing an example of generating eight sets of final parity check codes SF0-SF7 according to the parity check codes S0-S191 shown in FIG. 6.

The operations for generating the final parity check codes SF0-SF7 according to the multiple parity check codes S0-S191 are illustrated in FIG. 7.

In this embodiment, the parity check codes stored in the super block 540 serve as temporary parity check codes, that is the parity check codes S0-S191 stored in the super block 540 are used only when the an error (the data is erroneously programed or program fails) occurs during the programming operation of the data written into the super block 530. Therefore, after the final parity check codes SF0-SF7 are written into the super block 530, the parity check codes S0-S191 stored in the super block 540 are no longer needed.

Hence, the flash memory controller 110 can delete the contents of the super block 540 or mark the super block 540 as invalid/ineffective even if the contents within the super block are effective.

It should be noted that the above-mentioned final parity check codes SF0-SF7 are correspondingly generated based on the parity check codes S0-S191. The final parity check codes SF0-SF7 substantially carry information of each of the parity check codes S0-S191. That is, each of multiple parity check codes S0-S191 can be obtained according to corresponding data pages of flash memory chips. For example, the parity check codes S1 can be obtained by reading data from the data pages P1 of flash memory chips 512, 514, 522 and 524. Thus, the final parity check codes SF0-SF7 can be used to correct errors if data errors occur. For instance, if one word line in the word line set WL_G0 is open (e.g. a word line corresponding to data pages P0 of flash memory chip 514 is open), the flash memory controller 110 can re-generates the parity check codes S8, S16, . . . , S184 and final parity check code SF0 by reading data from other word line sets so as to re-generate the parity check code S0, and then can use the parity check code S0 and data content read from the data pages P0 of flash memory chips 512, 522, and 524 to generate data of the data page P0 of flash memory chip 514. The flash memory controller 110 can re-generate the parity check codes S9, S17, . . . , S185 and final parity check code SF1 by reading data from other word line sets so as to re-generate the s parity check code S1, and then can use the parity check code S1 and data content read from the data pages P1 of flash memory chips 512, 522, and 524 to generate data of the data page P1 of flash memory chip 514. Also, the flash memory controller 110 can re-generate data of data pages P2 and P3 of flash memory chip 514 similarly. As mentioned above, by the above operations, the data errors can be properly corrected to recover the data only if no multiple word lines in super block 530 are open simultaneously.

Additionally, if two word lines respectively positioned at word line sets WL_G0 and WL_G1 are short (e.g. two word lines correspondingly to the data pages P3 and P4 of flash memory chip 514 are short), the corresponding data can be also properly corrected to recover the data content of word line sets WL_G0 and WL_G1.

It should be noted that each of the data pages P0-P191 shown in FIG. 6 in other embodiments may indicate to comprise two or four data pages and is not limited to comprise only three data pages. For example, in the MLC flash memory structure, each of the data pages P0-P191 has two data pages; in the QLC flash memory structure, each of the data pages P0-P191 has four data pages.

In the embodiments shown in FIG. 6 and FIG. 7, the final parity check codes SF0-SF7 are generated by reading the parity check codes stored in the super block 540, however, it is not a limitation of the present invention. In another embodiment, the parity check code to be stored in the super block 540 can be encoded by using the parity check code corresponding to the previous word line set. For example, the second codec 134 can encode the $9^{th}$ data unit with the first parity check code S0 to generate the ninth parity check code S8, the second codec 134 can encode the $17^{th}$ data unit with the ninth parity check code S8 to generate the $17^{th}$ parity check code S16, . . . , and the second codec 134 can encode the $185^{th}$ data unit with the $177^{th}$ parity check code S176 to generate the $185^{th}$ parity check code S184. Therefore, because the $185^{th}$ parity check code S184 carry the information of the previous parity check codes S0, S8, S16, . . . , and S176, the $185^{th}$ parity check code S184 can serve as the final parity check code SF0, and the $185^{th}$ parity check code S184 can be directly stored into the data page P184 of the flash memory chip 524. Similarly, the final parity check codes SF1-SF7 can be generated by using the aforementioned method, and the final parity check codes SF1-SF7 stored into the data pages P185-P191 of the flash memory chip 524, respectively.

Additionally, in the embodiment of FIG. 5, the super block 530 consists of one TLC block of each of flash memory chips 512, 514, 522, and 524. However, in other embodiments, the flash memory module 120 may be configured as two block planes, and the super block 530 consists of two TLC blocks of each of flash memory chips 512, 514, 522, and 524. The two block planes within one chip is controlled by different chip enable signals. Similarly, the super block 540 may consist of two SLC blocks of each of flash memory chips 512, 514, 522, and 524.

Figure 8:
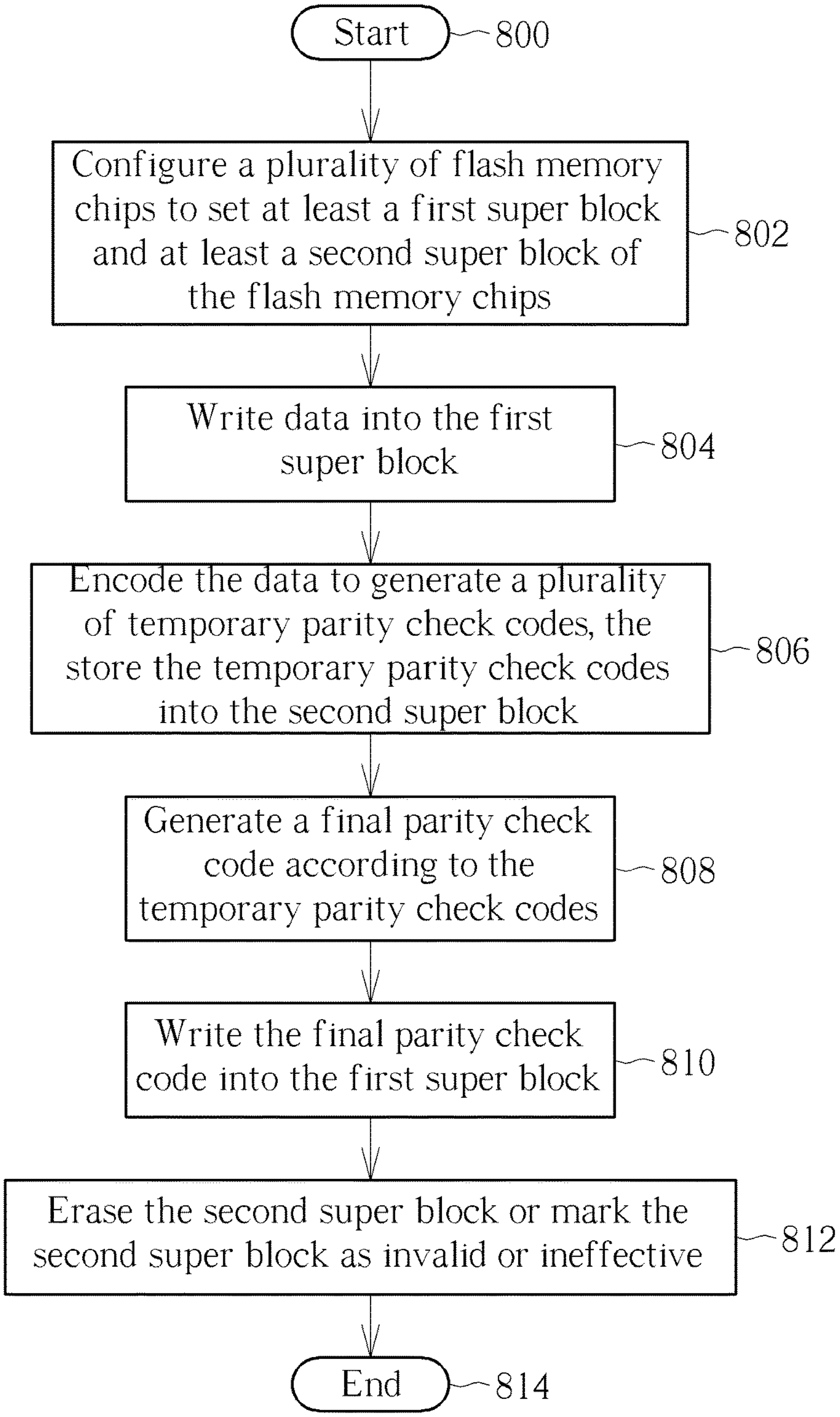
FIG. 8 is a flowchart of a method for accessing a flash memory module according to one embodiment of the present invention.

Refer to FIG. 8, which is a flowchart of a method for accessing a flash memory module according to one embodiment of the present invention. Referring to the aforementioned disclosure, the flow is described as follows.

Step 800: the flow starts.

Step 802: configure a plurality of flash memory chips to set at least a first super block and at least a second super block of the flash memory chips.

Step 804: write data into the first super block.

Step 806: encode the data to generate a plurality of temporary parity check codes, the store the temporary parity check codes into the second super block.

Step 808: generate a final parity check code according to the temporary parity check codes.

Step 810: write the final parity check code into the first super block.

Step 812: erase the second super block or mark the second super block as invalid or ineffective.

Step 814: the flow finishes.

To simply describe the spirits of the present invention, for the method for accessing the flash memory module, the second codec is arranged for sequentially performing encoding operations for multiple different data of multiple-layer blocks in one super block and storing temporary parity check codes, which are correspondingly generated, in a SLC super block. The second codec then is arranged for reading the temporary parity check codes stored in the SLC super block to generate final parity check codes having less data amount, and for storing the final parity check codes in last data pages of the odd word line sets and in last data pages of the even word line sets. By doing so, in addition to being capable of properly correcting data errors generated due to program fail, word line open, and word line short, the needed storage space of buffer memory in the flash memory controller can be significantly decreased, and it is not required to employ too much storage space to store the parity check codes. That is, the circuit costs of flash memory controller can be reduced, and the efficiency for using the flash memory module is improved greatly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for accessing a flash memory module, wherein the flash memory module is a 3D NAND-type flash memory module including a plurality of flash memory chips, each flash memory chip includes a plurality of blocks which include a plurality of multiple-level cell blocks and a plurality of single-level cell (SLC) blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages, and the method comprises:

encoding data to generate at least one parity check code, wherein the data is to be written into a first super block of the flash memory chips, and the first super block includes one multiple-level cell block of each flash memory chip among the flash memory chips;

writing the data into the first super block; and writing the at least one parity check code into a second super block, wherein the second super block includes one SLC block of each flash memory chip among the flash memory chips;

wherein the at least one parity check code is a temporary parity check code, and the method further comprises:

reading the at least one parity check code from the second super block, and generating a final parity check code according to the at least one parity check code; and writing the final parity check code into the first super block.

2. The method of claim 1, further comprising:

before the data is written into the first super block, encoding the data to generate the at least one parity check code, and storing the at least one parity check code into a buffer memory of a flash memory controller; and when error(s) occur due to writing procedure for the data or program fails, directly using the at least one parity check code stored in the buffer memory to correct the error(s) of the data.

3. The method of claim 1, further comprising:

during the data being written into the super block:

reading a portion of the data, which has been written into the first super block, from the first super block; and reading at least one portion of the parity check code from the second super block, and using the at least one portion of the parity check code to perform error correction upon the portion of the data when an error occurs and cannot be corrected during reading the portion of the data.

4. The method of claim 1, wherein the step of performing encoding upon the data to generate the at least one parity check code comprises:

sequentially encoding $1^{st}$-$N^{th}$ data units to generate $1^{st}$-$N^{th}$ parity check codes, respectively; and the step of writing the data into the first super block comprises:

respectively writing the $1^{st}$-$N^{th}$ data units into $1^{st}$-$N^{th}$ data pages corresponding to the flash memory chips of the first super block; and the step of writing the at least one parity check code into the second super block comprises:

writing the $1^{st}$-$N^{th}$ parity check codes into the second super block.

5. The method of claim 1, wherein the at least one parity check code is a temporary parity check code, and the method further comprises:

reading the $1^{st}$-$N^{th}$ parity check codes from the second super block, and generating a plurality of final parity check codes according to the $1^{st}$-$N^{th}$ parity check codes; and writing the plurality of final parity check codes into the first super block.

6. The method of claim 5, wherein multiple word lines positioned on a same plane of each block forms a word line set, and the step of writing the plurality of final parity check codes into the first super block comprises:

writing the plurality of final parity check codes into data pages of a flash memory chip corresponding to last two word line sets of the first super block.

7. The method of claim 6, wherein $P^{th}$-$N^{th}$ data units are also written into the data pages of the flash memory chip corresponding to the last two word line sets of the first super block.

8. The method of claim 6, further comprising:

after the final parity check code is written into the first super block, erasing contents of the second super block or marking the second super block as invalid/ineffective even if the data stored in the first super block is valid/effective.

9. The method of claim 1, wherein the multiple-level cell blocks are triple-level cell (TLC) blocks or quad-level cell (QLC) blocks.

10. A flash memory controller, wherein the flash memory controller is used to access a flash memory module, the flash memory module is a 3D NAND-type flash memory module including a plurality of flash memory chips, each flash memory chip includes a plurality of blocks which include a plurality of multiple-level cell blocks and a plurality of single-level cell (SLC) blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages, and the flash memory controller comprises:

a memory, for storing a program code;

a microprocessor, for executing the program code to control access of the flash memory module; and a codec;

wherein the codec encodes data to generate at least one parity check code, wherein the data is to be written into a first super block of the flash memory chips, and the first super block includes one multiple-level cell block of each flash memory chip among the flash memory chips; and the microprocessor writes the data into the first super block, and writes the at least one parity check code into a second super block, wherein the second super block includes one SLC block of each flash memory chip among the flash memory chips;

wherein during the data being written into the super block: the microprocessor reads a portion of the data, which has been written into the first super block, from the first super block; and the microprocessor reads at least one portion of the parity check code from the second super block, and uses the at least one portion of the parity check code to perform error correction upon the portion of the data when an error occurs and cannot be corrected during reading the portion of the data.

11. The flash memory controller of claim 10, wherein before the data is written into the first super block, the codec encodes the data to generate the at least one parity check code, and stores the at least one parity check code into a buffer memory of a flash memory controller; and when error(s) occur due to writing procedure for the data or program fails, the codec directly uses the at least one parity check code stored in the buffer memory to correct the error(s) of the data.

12. The flash memory controller of claim 10, wherein the at least one parity check code is a temporary parity check code, and the microprocessor reads the at least one parity check code from the second super block, and the codec generates a final parity check code according to the at least one parity check code, and the microprocessor writes the final parity check code into the first super block.

13. The flash memory controller of claim 10, wherein the codec sequentially encodes $1^{st}$-$N^{th}$ data units to generate $1^{st}$-$N^{th}$ parity check codes, respectively, and respectively writes the $1^{st}$-$N^{th}$ data units into $1^{st}$-$N^{th}$ data pages corresponding to the flash memory chips of the first super block; and the microprocessor writes the $1^{st}$-$N^{th}$ parity check codes into the second super block.

14. The flash memory controller of claim 10, wherein the at least one parity check code is a temporary parity check code, and the microprocessor reads the $1^{st}$-$N^{th}$ parity check codes from the second super block, and the codec generates a plurality of final parity check codes according to the $1^{st}$-$N^{th}$ parity check codes, and the microprocessor writes the plurality of final parity check codes into the first super block.

15. The flash memory controller of claim 14, wherein multiple word lines positioned on a same plane of each block forms a word line set, and the microprocessor writes the plurality of final parity check codes into data pages of a flash memory chip corresponding to last two word line sets of the first super block.

16. The flash memory controller of claim 15, wherein $P^{th}$-$N^{th}$ data units are also written into the data pages of the flash memory chip corresponding to the last two word line sets of the first super block.

17. The flash memory controller of claim 15, wherein after the final parity check code is written into the first super block, the microprocessor erases contents of the second super block or marks the second super block as invalid/ineffective even if the data stored in the first super block is valid/effective.

18. The flash memory controller of claim 10, wherein the multiple-level cell blocks are triple-level cell (TLC) blocks or quad-level cell (QLC) blocks.

19. A memory device, comprising:

a flash memory module, wherein the flash memory module is a 3D NAND-type flash memory module including a plurality of flash memory chips, each flash memory chip includes a plurality of blocks which include a plurality of multiple-level cell blocks and a plurality of single-level cell (SLC) blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages; and a flash memory controller, for accessing the flash memory module;

wherein when receiving a write request from a host device to write data into the flash memory module, the flash memory controller encodes the data to generate at least one parity check code, wherein the data is to be written into a first super block of the flash memory chips, and the first super block includes one multiple-level cell block of each flash memory chip among the flash memory chips; and the flash memory controller writes the data into the first super block, and writes the at least one parity check code into a second super block, wherein the second super block includes one SLC block of each flash memory chip among the flash memory chips;

wherein the at least one parity check code is a temporary parity check code, and the flash memory controller reads the at least one parity check code from the second super block, and generates a final parity check code according to the at least one parity check code, and writes the final parity check code into the first super block.

20. The memory device of claim 19, wherein before the data is written into the first super block, the flash memory controller encodes the data to generate the at least one parity check code, and stores the at least one parity check code into a buffer memory of the flash memory controller; and when error(s) occur due to writing procedure for the data or program fails, the flash memory controller directly uses the at least one parity check code stored in the buffer memory to correct the error(s) of the data.

21. The memory device of claim 19, wherein during the data being written into the super block: the flash memory controller reads a portion of the data, which has been written into the first super block, from the first super block; and the flash memory controller reads at least one portion of the parity check code from the second super block, and uses the at least one portion of the parity check code to perform error correction upon the portion of the data when an error occurs and cannot be corrected during reading the portion of the data.

22. A flash memory controller, wherein the flash memory controller is used to access a flash memory module, the flash memory module is a 3D NAND-type flash memory module including a plurality of flash memory chips, each flash memory chip includes a plurality of blocks which include a plurality of multiple-level cell blocks and a plurality of single-level cell (SLC) blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages, and the flash memory controller comprises:

a memory, for storing a program code;

a microprocessor, for executing the program code to control access of the flash memory module; and a codec;

wherein the codec encodes data to generate at least one parity check code, wherein the data is to be written into a first super block of the flash memory chips, and the first super block includes one multiple-level cell block of each flash memory chip among the flash memory chips; and the microprocessor writes the data into the first super block, and writes the at least one parity check code into a second super block, wherein the second super block includes one SLC block of each flash memory chip among the flash memory chips;

wherein the at least one parity check code is a temporary parity check code, and the microprocessor reads the at least one parity check code from the second super block, and the codec generates a final parity check code according to the at least one parity check code, and the microprocessor writes the final parity check code into the first super block.

23. A flash memory controller, wherein the flash memory controller is used to access a flash memory module, the flash memory module is a 3D NAND-type flash memory module including a plurality of flash memory chips, each flash memory chip includes a plurality of blocks which include a plurality of multiple-level cell blocks and a plurality of single-level cell (SLC) blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages, and the flash memory controller comprises:

a memory, for storing a program code;

a microprocessor, for executing the program code to control access of the flash memory module; and a codec;

wherein the codec encodes data to generate at least one parity check code, wherein the data is to be written into a first super block of the flash memory chips, and the first super block includes one multiple-level cell block of each flash memory chip among the flash memory chips; and the microprocessor writes the data into the first super block, and writes the at least one parity check code into a second super block, wherein the second super block includes one SLC block of each flash memory chip among the flash memory chips;

wherein the at least one parity check code is a temporary parity check code, and the microprocessor reads the $1^{st}$-$N^{th}$ parity check codes from the second super block, and the codec generates a plurality of final parity check codes according to the $1^{st}$-$N^{th}$ parity check codes, and the microprocessor writes the plurality of final parity check codes into the first super block.

24. A flash memory controller, wherein the flash memory controller is used to access a flash memory module, the flash memory module is a 3D NAND-type flash memory module including a plurality of flash memory chips, each flash memory chip includes a plurality of blocks which include a plurality of multiple-level cell blocks and a plurality of single-level cell (SLC) blocks, each block includes a plurality of data pages and includes a plurality of word lines respectively disposed on a plurality of different planes and a plurality of floating transistors controlled by a plurality of bit lines, the floating transistors on each bit line forms at least one page among the plurality of data pages, and the flash memory controller comprises:

a memory, for storing a program code;

a microprocessor, for executing the program code to control access of the flash memory module; and a codec;

wherein the codec encodes data to generate at least one parity check code, wherein the data is to be written into a first super block of the flash memory chips, and the first super block includes one multiple-level cell block of each flash memory chip among the flash memory chips; and the microprocessor writes the data into the first super block, and writes the at least one parity check code into a second super block, wherein the second super block includes one SLC block of each flash memory chip among the flash memory chips;

wherein after the final parity check code is written into the first super block, the microprocessor erases contents of the second super block or marks the second super block as invalid/ineffective even if the data stored in the first super block is valid/effective.

* * * * *